(12) United States Patent
Lule et al.

(10) Patent No.: US 10,009,558 B2
(45) Date of Patent: Jun. 26, 2018

(54) HIGH DYNAMIC RANGE IMAGE SENSOR

(71) Applicant: STMicroelectronics (Grenoble 2) SAS, Grenoble (FR)

(72) Inventors: Tarek Lule, Saint-Egreve (FR); Jérôme Chossat, Voiron (FR); Benoît Deschamps, Sassenage (FR)

(73) Assignee: STMicroelectronics (Grenoble 2) SAS, Grenoble (FR)

( * ) Notice: Subject to any disclaimer, the term of this patent is extended or adjusted under 35 U.S.C. 154(b) by 10 days.

(21) Appl. No.: 15/051,545

(22) Filed: Feb. 23, 2016

(65) Prior Publication Data
US 2017/0118424 A1    Apr. 27, 2017

(30) Foreign Application Priority Data
Oct. 26, 2015   (FR) ...................... 15 60206

(51) Int. Cl.
*H04N 3/14*     (2006.01)
*H04N 5/335*    (2011.01)
(Continued)

(52) U.S. Cl.
CPC ..... *H04N 5/3535* (2013.01); *H01L 27/14605* (2013.01); *H01L 27/14627* (2013.01);
(Continued)

(58) Field of Classification Search
CPC ............. H04N 5/3535; H04N 5/35572; H01L 27/14645; H01L 27/14641;
(Continued)

(56) References Cited

U.S. PATENT DOCUMENTS 6,278,149 B1 *   8/2001   Sato .................. H01L 27/10894
                                                              257/296
7,202,892 B1     4/2007   Ogata et al.
(Continued)

FOREIGN PATENT DOCUMENTS

| EP | 1 887 626 A1 | 2/2008 |
| EP | 2 549 745 A2 | 1/2013 |
| WO | 2004/074789 A1 | 9/2004 |

OTHER PUBLICATIONS

Silsby, et al., "A 1.2MP 1/3" CMOS Image Sensor with Light Flicker Mitigation," 2015 International Image Sensor Workshop (IISW), Vaals, The Netherlands, Jun. 8-11, 2015 (4 pgs.).
(Continued)

*Primary Examiner* — Yogesh Aggarwal
(74) *Attorney, Agent, or Firm* — Seed Intellectual Property Law Group LLP

(57) ABSTRACT

The present disclosure relates to an image sensor including: a plurality of pixels, each including a first photodiode coupled to a first capacitive charge storage node by a first transistor, and a second photodiode coupled to a second capacitive charge storage node by a second transistor; and a control circuit configured so as to, during a phase of acquisition of a value representative of the illumination level of a pixel: acquire a first output value representative of the illumination level received by the first photodiode during a first uninterrupted integration period; and acquire a second output value representative of the illumination level received by the second photodiode during a second integration period divided into a plurality of separate sub-periods.

20 Claims, 5 Drawing Sheets

(51) Int. Cl.
*H04N 5/353* (2011.01)
*H04N 5/355* (2011.01)
*H01L 27/146* (2006.01)

(52) U.S. Cl.
CPC .. *H01L 27/14636* (2013.01); *H01L 27/14641* (2013.01); *H01L 27/14645* (2013.01); *H04N 5/35572* (2013.01)

(58) Field of Classification Search
CPC ......... H01L 27/14627; H01L 27/14605; H01L 27/14636
USPC .................................................. 348/294–324
See application file for complete search history.

(56) References Cited

U.S. PATENT DOCUMENTS

| | | | |
|---|---|---|---|
| 7,286,174 B1 | 10/2007 | Weale et al. | |
| 7,586,074 B2 * | 9/2009 | Gulbransen | G01J 1/46 250/208.1 |
| 2008/0049128 A1 | 2/2008 | Murata et al. | |
| 2011/0140182 A1 | 6/2011 | Tanaka | |
| 2013/0113981 A1 * | 5/2013 | Knight | H04N 5/23212 348/345 |
| 2013/0135486 A1 | 5/2013 | Wan | |
| 2014/0247378 A1 | 9/2014 | Sharma et al. | |
| 2015/0009375 A1 | 1/2015 | Agranov et al. | |
| 2015/0156387 A1 | 6/2015 | Miyakoshi | |
| 2016/0105656 A1 * | 4/2016 | Lin | H04N 9/735 348/223.1 |
| 2016/0181314 A1 * | 6/2016 | Wan | H01L 27/14612 348/302 |

OTHER PUBLICATIONS

Willassen, et al., "A 1280x1080 4.2μ Split-diode Pixel HDR Sensor in 110nm BSI CMOS Process," 2015 International Image Sensor Workshop (IISW), Vaals, The Netherlands, Jun. 8-11, 2015 (4 pgs.).

* cited by examiner

HIGH DYNAMIC RANGE IMAGE SENSOR

BACKGROUND

Technical Field

The present disclosure relates to high dynamic range imaging.

Description of the Related Art

An image sensor conventionally comprises an array of pixels, each comprising a photodiode and a control circuit capable of delivering an output signal representative of the illumination level received by its photodiode. Such a sensor enables acquiring of a discretized and digitized image of a scene (or digital image). Such a sensor can however only discriminate a finite number of levels of illumination received by each photodiode. It is thus not always possible to capture the entire illumination range or dynamic range available in a scene with a single time of exposure of the photodiodes, especially when the scene has a high contrast.

To obtain a high dynamic range image, it has already been provided to successively acquire a plurality of images of a same scene with different times of exposure of the sensor, and then to merge these images in a high dynamic range image, where the values of the image points or pixels corresponding to the darkest areas of the scene are based on the values of the corresponding pixels of the image acquired with the longest exposure times, and the values of the pixels corresponding to the brightest areas in the scene are based on the values of the corresponding pixels of the images acquired with the shortest exposure times.

A problem which arises is that certain scenes comprise blinking light sources, for example, lightings or traffic lights with pulsed light-emitting diodes. Such light sources turn on and off at relatively high frequencies, typically in the range from 50 Hz to 2 kHz, with lighting duty cycles (on period to off period) which may be relatively low, for example, in the order of 0.1. In many situations, there is a risk for the light emitted by such sources not to be detected or to be incorrectly detected by the sensor. This problem particularly arises in the field of image sensors embarked in motor vehicles to analyze the vehicle environment. Indeed, scenes acquired by such sensors often have a high contrast and may comprise blinking light sources.

FIG. 1 schematically illustrates this issue. FIG. 1 shows two successive phases $T_{frame}$ of acquisition of a value representative of the illumination level of a photodiode of a pixel in a high dynamic range image sensor. Each acquisition phase $T_{frame}$ comprises one or a plurality of periods of integration of the pixel photodiode. In the shown example, each acquisition phase $T_{frame}$ comprises three successive integration periods $T_L$, $T_M$, and $T_S$ of the pixel photodiode. Time $T_L$ is longer than time $T_M$, which is itself longer than time $T_S$. The duration of integration periods $T_L$, $T_M$, and $T_S$ may vary from one acquisition phase to another according to the ambient brightness conditions, it being understood that the sum of times $T_L$, $T_M$, and $T_S$ is always smaller than or equal to time $T_{frame}$, which is generally constant. At the end of the first integration period (period $T_L$ in this example), a first value representative of the illumination level of the photodiode is read and stored, and the photodiode is reset before the beginning of the second integration period (period $T_M$ in this example). At the end of the second integration period, a second value representative of the illumination level of the photodiode is read and stored, and the photodiode is reset before the beginning of the third integration period (period $T_S$ in this example). At the end of the third integration period, a third value representative of the illumination level of the photodiode is read. A final output value of the pixel is then determined by taking into account the three previously-acquired illumination level values, corresponding to integration times $T_L$, $T_M$, and $T_S$.

FIG. 1 further shows a binary signal LED representative of the state of a blinking light source placed opposite the pixel, for example, a pulsed light-emitting diode source. The high state of signal LED corresponds to an on state of the light source, and the low state of signal LED corresponds to an off state of the light source. In this example, the blinking frequency of the light source is substantially equal to the frequency of image acquisition by the sensor (equal to $1/T_{frame}$), and the lighting duty cycle of the light source is 0.1. In the shown example, the light source is on for part of integration period $T_L$, and is off during all the rest of phase $T_{frame}$ and particularly during integration periods $T_M$ and $T_S$. Thus, during an acquisition phase $T_{frame}$, the light emitted by the light source is measured by the photodiode only during long integration period $T_L$ of the photodiode. However, in many situations, the pixel photodiode saturates during long integration period $T_L$ of acquisition phase $T_{frame}$, and the value read at the end of long integration period $T_L$ thus does not contribute to the final output value of the pixel. In this case, the turning-on of the light source during acquisition phase $T_{frame}$ is not detected by the pixel.

It should be noted that for blinking sources having a blinking frequency of the same order of magnitude as the acquisition frequency of the sensor, and a short on-state time as compared with acquisition period $T_{frame}$ of the sensor, the probability of being in the situation shown in FIG. 1 is relatively high, since integration period $T_L$ also occupies the most part of acquisition period $T_{frame}$.

When the ambient luminosity level increases, times $T_L$, $T_M$, and $T_S$ may be decreased and there then is a significant risk for the on period of the light source to fall outside of integration periods $T_L$, $T_M$, and $T_S$ of the sensor. Here again, the consequence is that the final output value of the pixel does not enable to detect the turning on of the light source.

Further, when the ambient luminosity level is relatively high, there is a significant probability for the pixel to saturate during integration periods $T_L$ and $T_M$ (periods $T_L$ and $T_M$ cannot be decreased to keep a significant general dynamic range in the image). Only exposure period $T_S$ could then capture a non-saturated value. However, period $T_S$ then being very short, the probability of detecting the light of the blinking source is low.

There thus is a need for a high dynamic range image sensor capable of detecting blinking light sources with a greater reliability than existing sensors.

BRIEF SUMMARY

To achieve this, an embodiment provides an image sensor comprising: a plurality of pixels, each comprising a first photodiode coupled to a first capacitive charge storage node by a first transistor, and a second photodiode coupled to a second capacitive charge storage node by a second transistor; and a control circuit configured so as to, during a phase of acquisition of a value representative of the illumination level of a pixel: acquiring a first output value representative of the illumination level received by the first photodiode during a first uninterrupted integration period; and acquiring a second output value representative of the illumination level received by the second photodiode during a second integration period divided into a plurality of separate sub-periods.

According to an embodiment, the second integration period is shorter than the first integration period and the sub-periods of the second integration period are distributed along a period substantially equal to the first integration period.

According to an embodiment, in each pixel, the second photodiode is further coupled to a third capacitive charge storage node by a third transistor, and the control circuit is further configured so as to, during a phase of acquisition of a value representative of the illumination level of a pixel, acquire a third output value representative of the illumination level received by the second photodiode during a third integration period divided into a plurality of separate sub-periods.

According to an embodiment, the third integration period is shorter than the first and second integration periods and the sub-periods of the third integration period are distributed along a period substantially equal to the first integration period.

According to an embodiment, the sub-periods of the second integration period and the sub-periods of the third integration period are interlaced.

According to an embodiment, the sub-periods of the second integration period have substantially the same duration and the same spacing, and the sub-periods of the third integration period have substantially the same duration and the same spacing.

According to an embodiment, the sub-periods of the second integration period have variable durations and/or spacings during the acquisition phase, and the sub-periods of the third integration period have variable durations and/or spacings during the acquisition phase.

According to an embodiment, the sub-periods of the second integration period and the sub-periods of the third integration period have a random or semi-random distribution.

According to an embodiment, in each pixel: the second capacitive node is coupled to a fourth node by a fourth transistor; the third capacitive node is coupled to the fourth node by a fifth transistor; the fourth node is coupled to a node of application of a reset potential by a sixth transistor; and the first node is coupled to the gate of a seventh transistor assembled as a follower source, the source of the seventh transistor being coupled to a first output conductive track by an eighth transistor.

According to an embodiment, in each pixel, the fourth node is coupled to the first node by a ninth transistor.

According to an embodiment, in each pixel, the fourth node is connected to the first node.

According to an embodiment, in each pixel, each of the first, second, and third nodes is coupled to a node of application of a reset potential by a reset transistor, and each of the first, second, and third nodes is connected to the gate of a transistor assembled as a follower source.

According to an embodiment, in each pixel, the second photodiode is further coupled to a node of application of a reset potential by a tenth transistor.

According to an embodiment, each pixel has its first photodiode topped by a first microlens of hexagonal shape, and its second photodiode topped by a second microlens of square shape, the side of the second microlens having substantially the same length as the side of the first microlens, and the first and second microlenses having a common side.

According to an embodiment, the capacitance of the second node comprises a capacitor with deep insulated trenches, or a capacitor having a vertical metal-oxide-metal stack.

According to an embodiment, the capacitance of the third node comprises a capacitor with deep insulated trenches, or a capacitor having a vertical metal-oxide-metal stack.

The foregoing and other features and advantages will be discussed in detail in the following non-limiting description of specific embodiments in connection with the accompanying drawings.

DETAILED DESCRIPTION

Figure 1:
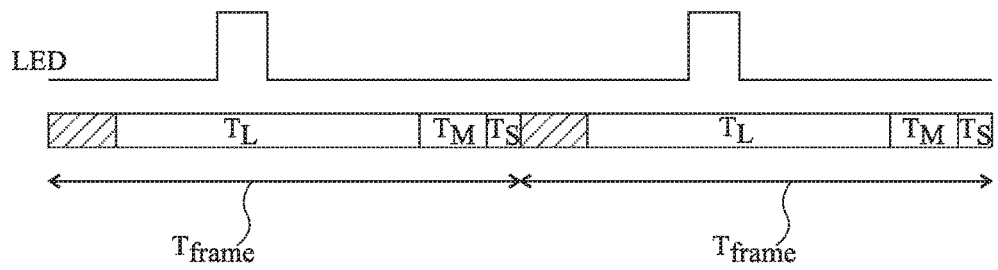
FIG. 1, previously described, schematically illustrates the issue of the detection of blinking light sources by a conventional high dynamic range image sensor.

The same elements have been designated with the same reference numerals in the different drawings and, further, the various drawings are not to scale. For clarity, only those elements which are useful to the understanding of the described embodiments have been shown and are detailed. In particular, the various peripheral elements that an image sensor may comprise, in addition to a pixel array (row and column decoder, read circuit, control circuit, signal processing unit, etc.) have not been detailed, the described embodiments being compatible with usual peripheral elements of an image sensor, provided to perform, possibly, adaptations which are within the abilities of those skilled in the art. Further, the methods of reconstructing a final output value of a pixel by taking into account intermediate output values corresponding to different exposure levels of the pixel have not been detailed, the described embodiments being compatible with reconstruction methods currently used in high dynamic range sensors. Unless otherwise specified, expressions "approximately", "substantially", "about", and "in the order of" mean to within 10%, preferably to within 5%. In the present description, the term "connected" is used to designate a direct electric connection, with no intermediate electronic component, for example, by means of one or a plurality of conductive tracks, and the term "coupled" is used to designate either a direct electric connection (then meaning "connected") or a connection via one or a plurality of intermediate components (resistor, diode, capacitor, etc.).

Figure 2:
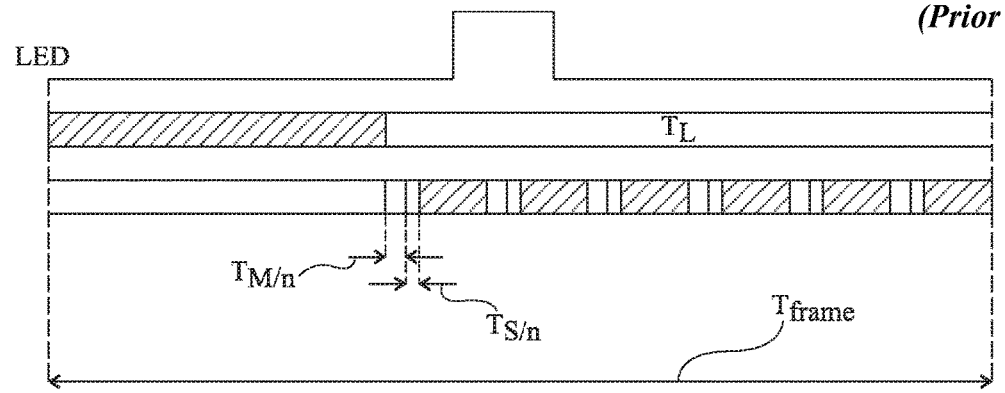
FIG. 2 schematically illustrates the operation of an embodiment of a high dynamic range image sensor.

FIG. 2 schematically illustrates the operation of an embodiment of a high dynamic range image sensor.

As shown in the example of FIG. 1, a sensor is configured so as to, for each acquisition period (referred to herein, interchangeably, as acquisition "period" or "phase") $T_{frame}$ of a value representative of the illumination level of a pixel, acquire three values representative of the illumination level of the pixel, corresponding to three different exposure levels of the pixel, and then reconstruct a final output value of the pixel by taking into account these three values. In the example of FIG. 2, a sensor where each pixel comprises two different photodiodes capable of being simultaneously integrated or exposed, with different exposure times, is considered.

FIG. 2 shows a single phase $T_{frame}$ of acquisition of a value representative of the illumination level of a pixel of the sensor. Acquisition phase $T_{frame}$ comprises an uninterrupted period $T_L$ of integration of a first photodiode of the pixel. Acquisition phase $T_{frame}$ further comprises, in parallel with integration period $T_L$, that is, at least partly overlapping integration period $T_L$, two integration periods $T_M$ and $T_S$ of the second photodiode of the pixel. As a variation (not shown), integration periods $T_M$ and $T_S$ may be outside of integration period $T_L$. As in the example of FIG. 1, time $T_L$ is longer than time $T_M$, which is itself longer than time $T_S$. The described embodiments are however not limited to this specific case. As a variation, integration times $T_S$ and $T_M$ may be substantially identical, which enables to improve the detection performance of blinking light sources at the cost of a slight decrease of the dynamic range. In the example of FIG. 2, integration period $T_M$ is divided into n separate integration sub-periods of duration $T_M/n$, and integration period $T_S$ is divided into n separate integration sub-periods of duration $T_S/n$, where n is an integer greater than 1, for example, in the range from 10 to 500. In the shown example, the integration sub-periods of integration period $T_M$ and the integration sub-periods of integration period $T_S$, are interlaced, that is, two successive sub-periods of integration period $T_M$ are separated by a sub-period of integration period $T_S$, and two successive sub-periods of integration period $T_S$ are separated by a sub-period of integration period $T_M$. In this example, the integration sub-periods of integration period $T_M$ and the integration sub-periods of integration period $T_S$ are distributed over a period longer than the sum of periods $T_M$ and $T_S$.

In the shown example, the n sub-periods of integration period $T_M$ and the n sub-periods of integration period $T_S$ are regularly distributed along a period substantially equal to integration period $T_L$, and substantially coinciding with integration period $T_L$. An advantage then is the time consistency of the measurements performed at the end of integration periods $T_L$, $T_M$ and $T_S$. As a variation, the n sub-periods of integration period $T_M$ and the n sub-periods of integration period $T_S$ may be regularly distributed all along acquisition period $T_{frame}$.

FIG. 2 further shows a binary signal LED representative of the state of a blinking light source placed opposite the pixel, for example, a source with pulsed light-emitting diodes. The high state of signal LED corresponds to an on state of the light source, and the low state of signal LED corresponds to an off state of the light source. In the shown example, the light source is on for approximately one sixth of long integration period $T_L$, and is turned off during all the rest of phase $T_{frame}$. The division of integration periods $T_M$ and $T_S$ into separate integration sub-periods and the spreading of these sub-periods along a period longer than the sum of periods $T_M$ and $T_S$ increases the probability for at least part of integration period $T_M$ and/or at least part of integration period $T_S$ to coincide with the on phase of the blinking light source. In the shown example, a sub-period of duration $T_M/n$ of integration period $T_M$ and a sub-period of duration $T_S/n$ of integration period $T_S$ fall during the on phase of the blinking light source. Thus, part of the light emitted by the light source during acquisition phase $T_{frame}$ is detected by the pixel and contributes to the final output value of the pixel. The provision of an uninterrupted integration period $T_L$ on a separate photodiode enables to guarantee a fine performance of the pixel in low brightness conditions.

Examples of architectures of pixels and of methods of controlling such pixels to implement an operation of the type illustrated in FIG. 2 will be described in further detail hereafter in relation with FIGS. 3, 4, 5 and 6.

Figure 3:
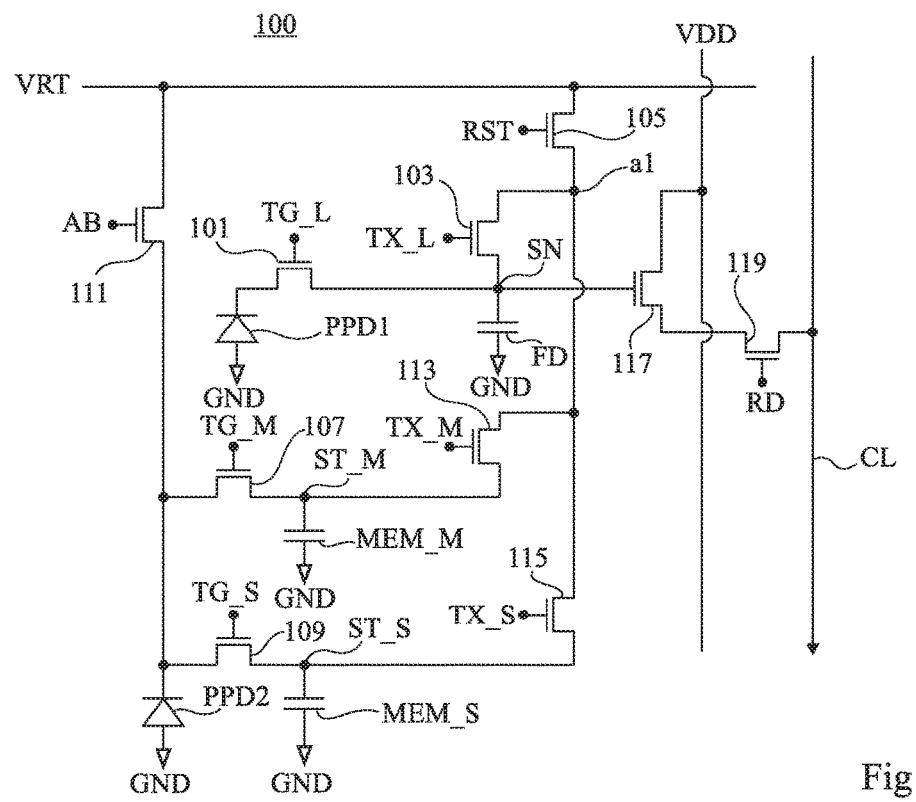
FIG. 3 is an electric diagram of an embodiment of a high dynamic range image sensor.

FIG. 3 is an electric diagram of an embodiment of a high dynamic range image sensor capable of implementing an operation of the type described in relation with FIG. 2. In FIG. 3, a single pixel 100 of the sensor has been shown. In practice, the sensor may comprise a plurality of identical or similar pixels arranged in an array in rows and columns, as well as circuits for controlling the sensor pixels, not shown.

Pixel 100 of FIG. 3 comprises a first photodiode PPD1. The anode of photodiode PPD1 is connected to a node GND of application of a low reference potential of the sensor, for example, the ground. The cathode of photodiode PPD1 is coupled to a capacitive sense node SN of the pixel via a transfer transistor 101 having its gate coupled to a node of application of a control signal TG_L. The capacitance of sense node SN is schematically represented by a capacitor FD having a first electrode connected to node SN and having a second electrode connected to node GND. In practice, capacitance FD may be formed by the stray capacitances of the different elements (conductive tracks, transistors) connected to node SN. As a variation, capacitance FD may comprise a specific capacitor, to increase its maximum sense node charge storage capacitance and thus decrease the charge-to-voltage conversion gain. Sense node SN is coupled to a node a1 of the pixel via a transistor 103 having its gate coupled to a node of application of a control signal TX_L. Node a1 is itself connected to a node VRT of application of a high reference potential—that is, higher than the potential of node GND—of the sensor via a transistor 105 having its gate coupled to a node of application of a control signal RST.

Pixel 100 of FIG. 3 further comprises a second photodiode PPD2. The anode of photodiode PPD2 is connected to node GND. The cathode of photodiode PPD2 is coupled to a first capacitive sense node ST_M of the pixel via a transfer transistor 107 having its gate coupled to a node of application of a control signal TG_M. The capacitance of storage node ST_M is schematically shown by a capacitor MEM_M having a first electrode connected to node ST_M and having a second electrode connected to node GND. In practice, capacitance MEM_M may be formed by the stray capacitances of the different elements (conductive tracks, transistors) connected to node ST_M. As a variation, capacitance MEM_M may comprise a specific capacitor. Capacitance MEM_M for example may include a capacitor with vertical electrodes of CDTI type ("Capacitor Deep Trench Isolation") formed in the same semiconductor substrate as the photodiodes and transistors of the pixel. The provision of a CDTI advantageously enables to limit the substrate surface area occupied by the pixel. More generally, various types of capacitors with vertical electrodes may be used, for example, a MOM (metal-oxide-metal) capacitor, a MIM (metal-insulator-metal) capacitor, or a MOS (metal-oxide-semiconductor) capacitor. Capacitance MEM_M of node ST_M is preferably greater than capacitance FD of node SN, to decrease kTC noise and increase the dynamic range. The cathode of photodiode PPD2 is further coupled to a second capacitive storage node ST_S of the pixel via a transfer transistor 109 having its gate coupled to a node of application of a control signal TG_S. The capacitance of storage node ST_S is schematically represented by a capacitor MEM_S having a first electrode connected to node ST_S and having a second electrode connected to node GND. In practice, capacitance MEM_S may be formed by the stray capacitances of the different elements (conductive tracks, transistors) connected to node ST_S. As a variation, capacitance MEM_S may comprise a specific capacitor. Like capacitance MEM_M, capacitance MEM_S for example may include a capacitor with vertical electrodes formed in the same semiconductor substrate as the pixel photodiodes and transistors. Capacitance MEM_S of node ST_S is preferably greater than capacitance MEM_M of node ST_M, to still further decrease kTC noise and still further increase the dynamic range. The cathode of photodiode PPD2 is further coupled to node VRT via a transistor 111 having its gate coupled to a node of application of a control signal AB. Pixel 100 of FIG. 3 further comprises a transistor 113 coupling node ST_M to node a1, the gate of transistor 113 being coupled to a node of application of a control signal TX_M. Further, pixel 100 comprises a transistor 115 coupling node ST_S to node a1, the gate of transistor 115 being coupled to a node of application of a control signal TX_S.

Pixel 100 further comprises a transistor 117 assembled as a follower source, having its gate connected to sense node SN. The drain of transistor 117 is connected to a node VDD of application of a high reference potential of the sensor, for example, equal to the potential of node VRT, or different from the potential of node VRT. Pixel 100 further comprises a transistor 119 coupling the source of transistor 117 to an output conductive track CL of the pixel, which may be common to a plurality of pixels of the sensor, for example, to all the pixels of a same column of the sensor. The gate of transistor 119 is coupled to a node of application of a control signal RD.

As a variation, the pixel read circuit, comprising transistors 105, 117 and 119, may be shared by one or a plurality of neighboring pixels.

In the shown example, transistors 101, 103, 105, 107, 109, 111, 113, 115, 117, and 119 of pixel 100 are N-channel MOS transistors. Photodiodes PPD1 and PPD2 for example are pinned photodiodes, that is, fully depleted photodiodes in the reset state. The described embodiments are however not limited to these specific examples.

The sensor of FIG. 3 further comprises a control circuit, not shown, outputting control signals AB, TG_L, TG_M, TG_S, TX_L, TX_M, TX_S, RST, and RD of the transistors for controlling the sensor pixels. The pixels are for example simultaneously controlled row by row, that is, all the pixels of a same row simultaneously receive the same signals AB, TG_L, TG_M, TG_S, TX_L, TX_M, TX_S, RST and RD for controlling their control transistors. The sensor of FIG. 3 is for example controlled according to a rolling shutter type control method, that is, the control sequence of the transistors of the pixels of a same row during a phase $T_{frame}$ of acquisition of the output values of the pixels of the line is repeated identically for all the sensor rows, with a phase shift in the order of $T_{frame}$/Nb_row between two successive pixel rows, where Nb_row designates the number of pixel rows of the sensor.

Figure 4:
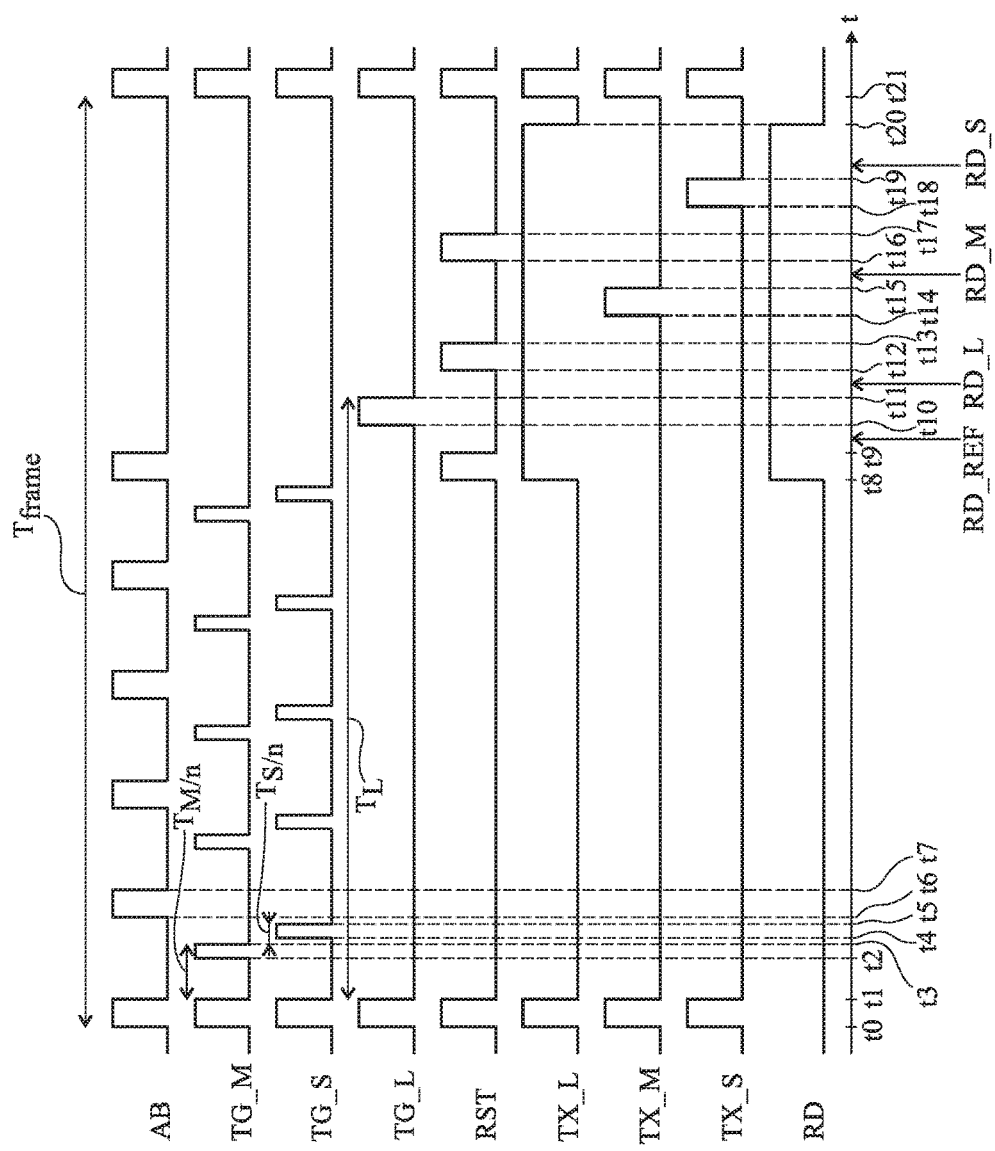
FIGS. 4, 5, and 6 are timing diagrams illustrating an example of a method of controlling the sensor of FIG. 3.
Figure 5:
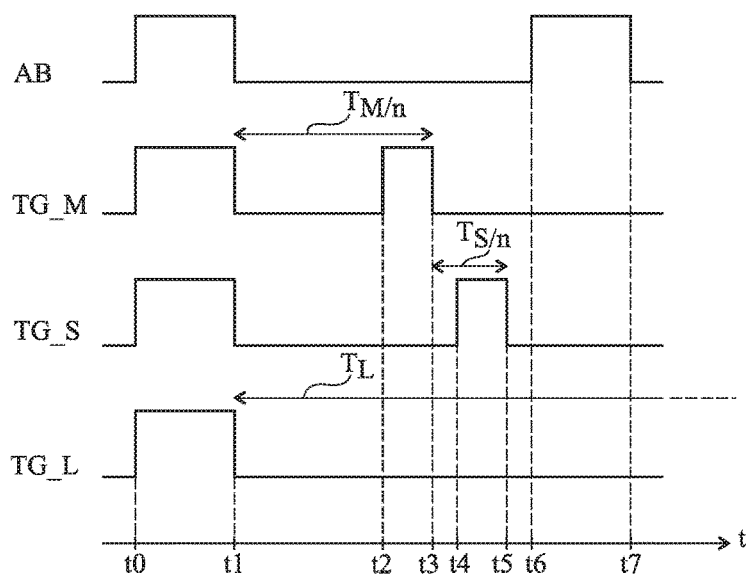
Figure 6:
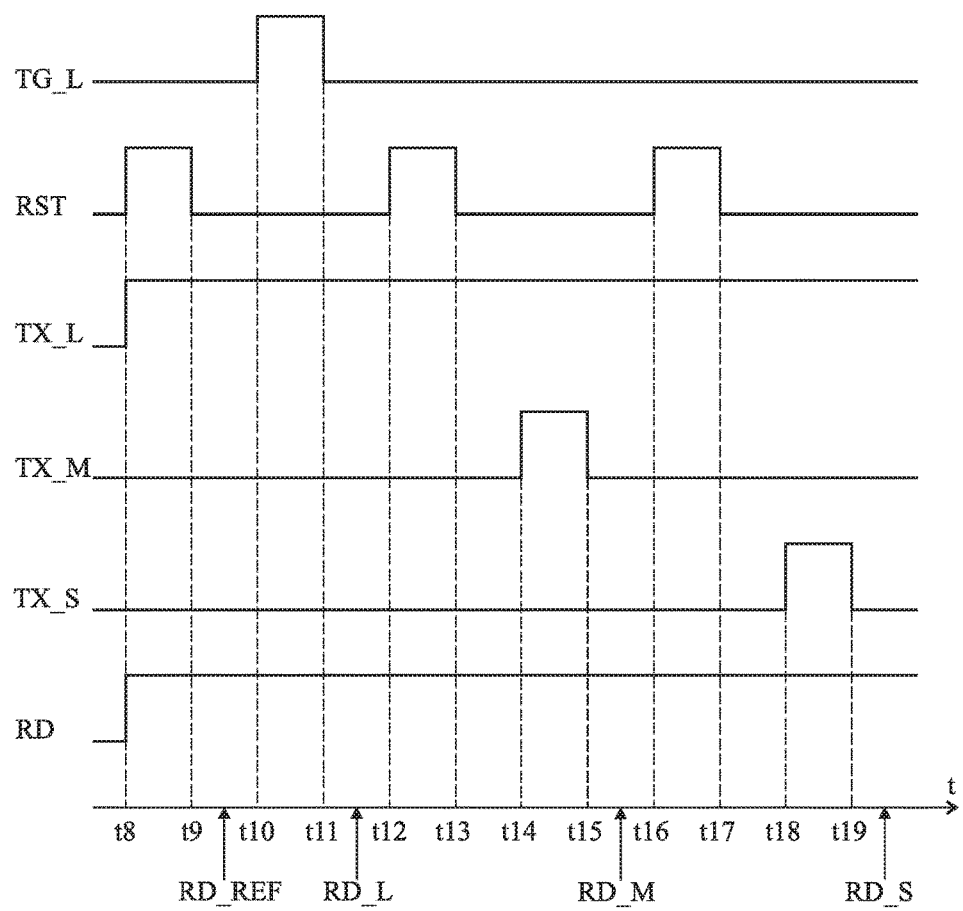

FIG. 4 is a timing diagram illustrating an example of a method of controlling the sensor of FIG. 3. More particularly, FIG. 4 shows the variation, over time (t), of control signals AB, TG_L, TG_M, TG_S, TX_L, TX_M, TX_S, RST, and RD of pixel 100 of FIG. 3, during a phase $T_{frame}$ of acquisition of an output value representative of the illumination level of the pixel. FIGS. 5 and 6 are enlargements of portions of the timing diagram of FIG. 4.

At a time t0 of beginning of acquisition phase $T_{frame}$, signals AB, TG_L, TG_M, TG_S, TX_L, TX_M, TX_S, and RST are in the high state, which causes the turning-on of transistors 101, 103, 105, 107, 113, 109, 115, and 111, and accordingly the resetting of photodiodes PPD1 and PPD2, and the resetting of sense node SN and of storage nodes ST_M and ST_S to potentials close to the potential of node VRT. Signal RD is in the low state to maintain transistor 119 off, to isolate output track CL from the rest of the pixel.

At a time t1 subsequent to time t0, signals AB, TG_L, TG_M, TG_S, TX_L, TX_M, TX_S, and RST are set to the low state, which turns back off transistors 101, 103, 105, 107, 113, 109, 115, and 111. Time t1 corresponds to the beginning of integration period $T_L$ of photodiode PPD1 and the beginning of the first sub-period of integration period $T_M$ of photodiode PPD2.

At a time t2 subsequent to time t1, signal TG_M is set to the high state, which causes the turning on of transistor 107 and the transfer, onto storage node ST_M, of the photogenerated charges stored in photodiode PPD2 since time t1.

At a time t3 subsequent to time t2, signal TG_M is set back to the low state, causing the turning back off of transistor 107. Time t3 marks the end of the first integration sub-period of integration period $T_M$ of photodiode PPD2. Time t3 further marks the beginning of the first sub-period of integration period $T_S$ of photodiode PPD2.

At a time t4 subsequent to time t3, signal TG_S is set to the high state, which causes the turning on of transistor 109, and the transfer, onto storage node ST_S, of the photogenerated charges stored in photodiode PPD2 since time t3. As a variation, times t3 and t4 may be confounded, provided to ascertain that transistors 107 and 109 are not simultaneously in the off state.

At a time t5 subsequent to time t4, signal TG_S is set back to the low state, causing the turning back off of transistor 109. Time t5 marks the end of the first sub-period of integration period $T_S$ of photodiode PPD2.

At a time t6 subsequent to time t5, signal AB is set to the high state, which causes the turning on of transistor 111, and accordingly the resetting of photodiode PPD2 (that is, the draining off of all the charges of photodiode PPD2 in the case of a pinned photodiode).

At a time t7 subsequent to time t6, signal AB is set back to the low state, causing the turning back off of transistor 111. Time t7 corresponds to the beginning of the second sub-period of integration period $T_M$ of photodiode PPD2.

The control sequence of signals TG_M, TG_S, and AB from time t1 to time t7 is repeated n times, where n is the number of sub-periods into which integration periods $T_M$ and $T_S$ of photodiode PPD2 are divided. For simplification, the timing diagram of FIG. 4 has been plotted for n=5.

The provision of a pinned photodiode PPD2, that is, a photodiode fully depleted in the reset state, advantageously enables to ensure an efficient transfer, to storage node ST_M, respectively ST_S, of the set of photogenerated charges in photodiode PPD2 at the end of each sub-period of integration period $T_M$, respectively $T_S$. Another advantage is that the use of a pinned photodiode enables to significantly decrease the dark current, since the charges are stored in the bulk of the photodiode. Thereby, the acquired signals are relatively independent from the interface states at the limits of the photodiode. Further, the use of a pinned photodiode enables to implement a CDS ("Correlated Double Sampling") reading, independent from kTC noise.

It should be noted that an additional resetting of photodiode PPD2 via transistor 111 may optionally be provided between the end of each sub-period of integration period $T_M$ and the beginning of the next sub-period of integration period $T_S$, that is, between times t3 and t4.

At a time t8 subsequent to time t1, for example, after the end of the last sub-period of integration period $T_S$ of photodiode PPD2, signals RST and TX_L are set to the high state, which causes the turning on of transistors 105 and 103, and accordingly the resetting of sense node SN to a potential close to the potential of node VRT. In this example, signal RD is further set to the high state at time t8, which causes the turning on of transistor 119. Thus, a potential representative of the potential of sense node SN is transferred onto output track CL via transistors 117 and 119.

At a time t9 subsequent to time t8, signal RST is set back to the low state, causing the turning back off of transistor 105. After time t9, during a step RD_REF, the potential of output track CL is read and stored.

At a time t10 subsequent to read step RD_REF, signal TG_L is set to the high state, which causes the turning on of transistor 101, and the transfer, onto sense node SN, of the photogenerated charges stored in photodiode PPD1 since time t1 of beginning of integration period $T_L$.

At a time t11 subsequent to time t10, signal TG_L is set back to the low state, causing the turning back off of transistor 101. Time t11 marks the end of integration period $T_L$ of photodiode PPD1. After time t11, at a step RD_L, the potential of output track CL is read. Calling $V_{REF}$ the potential read from output track CL at step RD_REF and $V_L$ the potential read from output track CL at step RD_L, value $V_{REF}-V_L$ defines a first output value of the pixel, corresponding to a first exposure level.

At a time t12 subsequent to read step RD_L, signal RST is set to the high state, causing the turning on of transistor 105 and accordingly the resetting of sense node SN to a potential close to the potential of node VRT.

At a time t13 subsequent to time t12, signal RST is set back to the low state, causing the turning back off of transistor 105.

At a time t14 subsequent to time t13, signal TX_M is set to the high state, which causes the turning on of transistor 113. The photogenerated charges stored on storage node ST_M during integration period $T_M$ of photodiode PPD2 then distribute on nodes ST_M, a1, and SN.

At a time t15 subsequent to time t14, signal TX_M is set back to the low state, which causes the turning back off of transistor 113. After time t15, during a step RD_M, the potential of output track CL is read. This potential defines a second output value of the pixel, corresponding to a second exposure level lower than the first level. It should be noted that in this example, the signal read at step RD_M contains a noise component kTC generated by the turning off of transistor 113. This component may be suppressed by reading the potential of output track CL before time t15 at which transistor 113 is turned off (between times t14 and t15). In this case, the read signal contains a component linked to the charge injection by the turning on of transistor 113.

At a time t16 subsequent to read step RD_M, signal RST is set to the high state, causing the turning on of transistor 105 and accordingly the resetting of sense node SN to a potential close to the potential of node VRT.

At a time t17 subsequent to time t16, signal RST is set back to the low state, causing the turning back off of transistor 105. As a variation, signal TX_M may be maintained in the high state until a time subsequent to time t16, for example, until t17, to reset storage node ST_M to a potential close to the potential of node VRT.

At a time t18 subsequent to time t17, signal TX_S is set to the high state, which causes the turning on of transistor 115. The photogenerated charges stored on storage node ST_S during integration period $T_S$ of photodiode PPD2 then distribute on nodes ST_S, a1, and SN.

At a time t19 subsequent to time t18, signal TX_S is set back to the low state, which causes the turning back off of transistor 115. After time t19, during a step RD_S, the potential of output track CL is read. This potential defines a third output value of the pixel, corresponding to a third exposure level lower than the first and second levels. It should be noted that in this example, the signal read at step RD_S contains a noise component kTC generated by the turning off of transistor 115. This component may be suppressed by reading the potential of output track CL before time t19 at which transistor 115 is turned off (between times t18 and t19). In this case, the read signal contains a component linked to the charge injection by the turning-on of transistor 115.

A final output value of the pixel may then be determined by taking into account the output values corresponding to the first, second, and third exposure levels.

It should be noted that the potential of node ST_S may be reset to a value close to the potential of node VRT by simultaneously turning on transistors 105 and 115 (signals RST and TX_S simultaneously in the high state).

At a time t20 subsequent to time t19, signal RD is set back to the low state, which causes the turning off of transistor 119. In this example, signal TX_L is further set back to the low state at time t20, which causes the turning off of transistor 103.

At a time t21 marking the end of acquisition phase $T_{frame}$ signals AB, TG_L, TG_M, TG_S, TX_L, TX_M, TX_S, and RT are set to the high state to reset the pixel for a new acquisition phase.

Different variations of the control method described in relation with FIG. 4 may be implemented.

In particular, although an embodiment where transistor 103 is maintained off during read steps RD_REF and RD_L has been described, the described embodiments are not limited to this specific case. The maintaining of transistor 103 in the on state during read steps RD_REF and RD_L results in increasing the capacitance seen by sense node SN of the pixel during these read steps, by adding the capacitance of node a1 thereto. This results in decreasing the voltage levels read from output track CL of the pixel. In low brightness conditions, it may conversely be decided to turn off transistor 103 during read steps RD_REF and RD_L, to increase the voltage levels read from output track CL of the pixel. In this case, the variation of control signal TX_L of transistor 103 may for example be identical to that of signal RST in the period from time t8 to time t20.

An example of a control method where the reading of the illumination level received by photodiode PPD1 during long integration period $T_L$ is a reading of correlated double sampling type, that is, comprising a step of resetting sense node SN and then of reading the reset voltage of node SN, followed by a step of transferring the photogenerated charges stored in photodiode PPD1 onto sense node SN and then of reading the potential of node SN, has been described hereabove. Such a read mode enables to provide a pixel output value with very little noise for the first exposure level, which is particularly advantageous in low brightness conditions. However, as a variation, the steps of resetting sense node SN (setting signal RST to the high state between times t8 and t9) and of reading the reset potential of sense node SN (step RD_REF) may be omitted.

Figure 7:
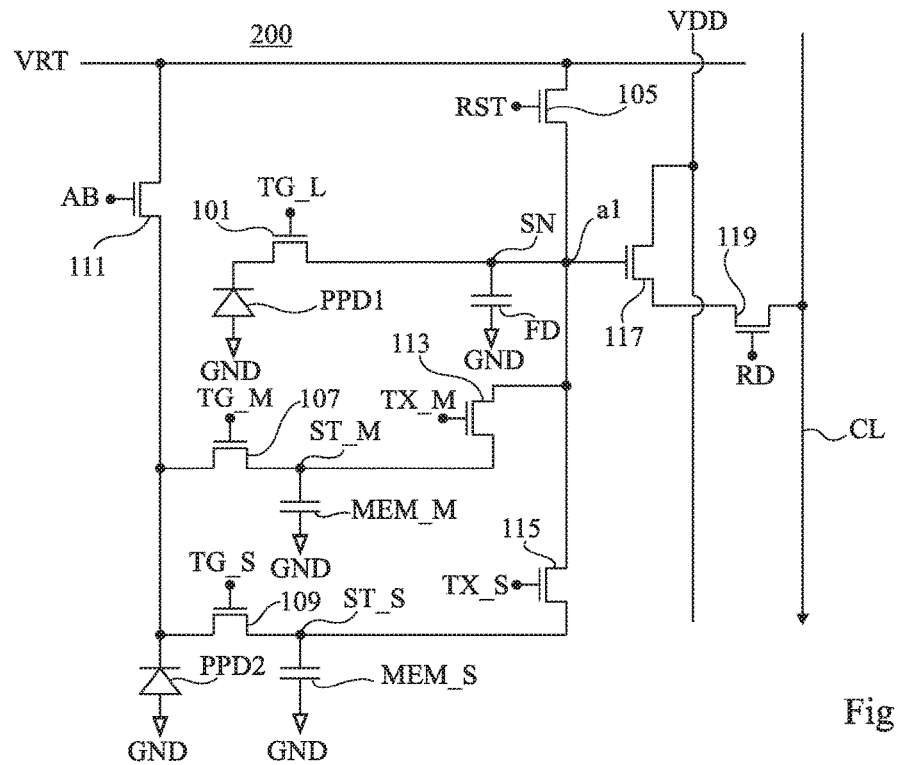
FIG. 7 is an electric diagram of another embodiment of a high dynamic range image sensor.

FIG. 7 is an electric diagram of another embodiment of a high dynamic range image sensor capable of implementing an operation of the type described in relation with FIG. 2. In FIG. 7, a single pixel 200 of the sensor has been shown. In practice, the sensor may comprise a plurality of identical or similar pixels arranged in an array in rows and columns, as well as sensor pixel control circuits, not shown.

Pixel 200 of FIG. 7 comprises many elements common with pixel 100 of FIG. 3. These elements will not be described again. Pixel 200 of FIG. 7 differs from pixel 100 of FIG. 3 primarily in that it does not include transistor 103 of pixel 100 of FIG. 3 between sense node SN and node a1. In pixel 200 of FIG. 7, node SN is directly connected to node a1.

Pixel 200 of FIG. 7 does not enable to insulate sense node SN from node a1 to perform a reading of photodiode PPD1 with a high charge-to-voltage conversion gain, as allowed by pixel 100 of FIG. 3. However, an advantage of pixel 200 of FIG. 7 is that it comprises one less transistor than pixel 100 of FIG. 3, which enables to decrease the total surface area of the pixel.

The sequence of control signals AB, TG_L, TG_M, TG_S, TX_M, TX_S, RST, and RD described in relation with FIG. 4 may be substantially identically applied to pixel 200 of FIG. 7.

Figure 8:
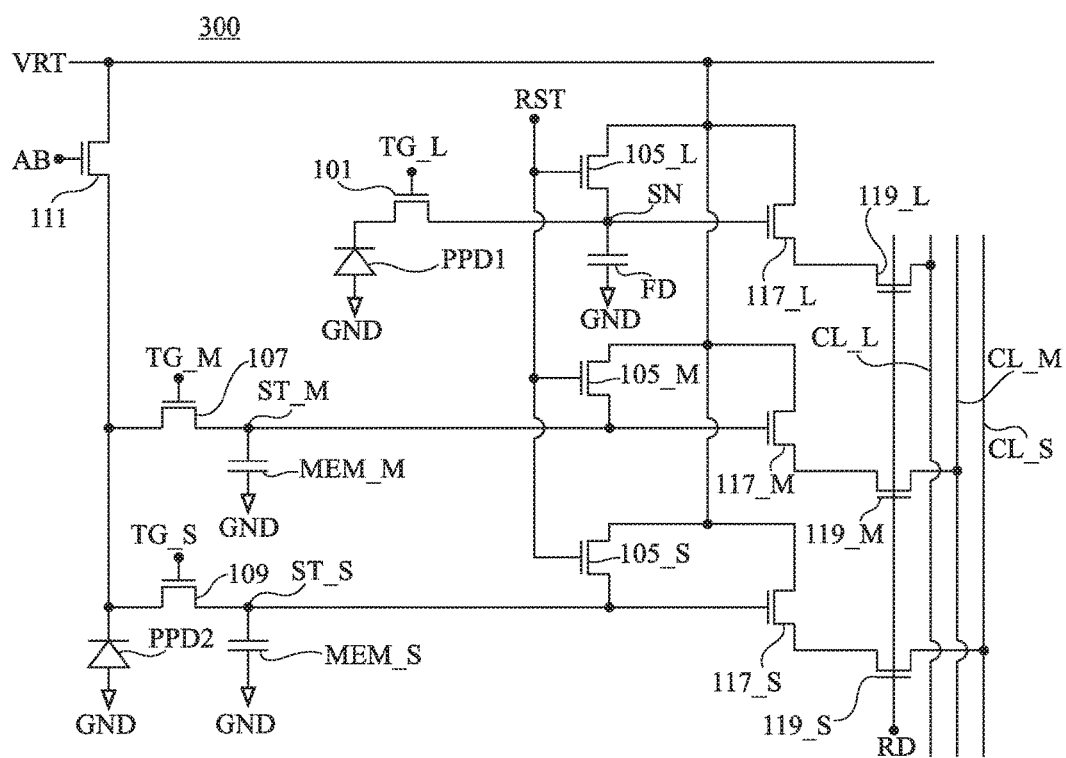
FIG. 8 is an electric diagram of another embodiment of a high dynamic range image sensor.

FIG. 8 is an electric diagram of another embodiment of a high dynamic range image sensor capable of implementing an operation of the type described in relation with FIG. 2. In FIG. 8, a single pixel 300 of the sensor has been shown. In practice, the sensor may comprise a plurality of identical or similar pixels arranged in an array in rows and columns, as well as sensor pixel control circuits, not shown.

Pixel 300 of FIG. 8 comprises elements common with pixels 100 of FIG. 3 and 200 of FIG. 7. In particular, pixel 300 of FIG. 8 comprises two photodiodes PPD1 and PPD2 having their anodes connected to a node GND of application of a low reference potential, a transfer transistor 101 receiving a control signal TG_L and coupling the cathode of photodiode PPD1 to a capacitive sense node SN of capacitance FD, a transfer transistor 107 receiving a control signal TG_M and coupling the cathode of photodiode PPD2 to a capacitive storage node ST_M of capacitance MEM_M, a transfer transistor 109 receiving a control signal TG_S and coupling the cathode of photodiode PPD2 to a capacitive storage node ST_S of capacitance MEM_S, and a transistor 111 for resetting photodiode PPD2 coupling the cathode of photodiode PPD2 to a node VRT of application of a high reference potential.

Pixel 300 of FIG. 8 further comprises a first reset transistor 105_L coupling node SN to node VRT, a second reset transistor 105_M coupling node ST_M to node VRT, and a third reset transistor 105_S coupling node ST_S to node VRT. The gates of transistors 105_L, 105_M, and 105_S are coupled to a same node of application of a control signal RST.

Pixel 300 of FIG. 8 further comprises a first transistor 117_L assembled as a follower source, having its gate connected to sense node SN, a second transistor 117_M assembled as a follower source, having its gate connected to node ST_M, and a third transistor 117_S assembled as a follower source, having its gate connected to node ST_S. Each of transistors 117_L, 117_M, and 117_S has its drain coupled to node VRT. Pixel 300 further comprises a first selection transistor 119_L coupling the source of transistor 117_L to a first output conductive track CL_L of the pixel, a second selection transistor 119_M coupling the source of transistor 117_M to a second output conductive track CL_M of the pixel, and a third selection transistor 119_S coupling the source of transistor 117_S to a third output conductive track CL_S of the pixel. Output tracks CL_L, CL_M, and CL_S may be common to a plurality of pixels of the sensor, for example, to all the pixels of a same column of the sensor. In this example, the gates of selection transistors 119_L, 119_M, and 119_S of pixel 300 are coupled to a same node of application of a control signal RD. Transistors 105_L, 105_M, 105_S, 117_L, 117_M, 117_S, 119_L, 119_M, and 119_S are for example N-channel MOS transistors, but the described embodiments are however not limited to this specific case.

Thus, the main difference between pixel 300 of FIG. 8 and pixels 100 of FIG. 3 and 200 of FIG. 7 is that, in pixel 300, each of capacitive storage nodes ST_M and ST_S, intended to store the charges photogenerated during integration periods $T_M$ and $T_S$, respectively, has its own read circuit. This enables to avoid the sharing of the charges photogenerated between nodes ST_M, a1, and SN on the one hand, and between node ST_S, a1, and SN on the other hand, during the reading of the voltage levels of nodes ST_M and ST_S at the end of integration periods $T_M$ and $T_S$. Thus, this enables to increase the voltage levels read at the pixel output and corresponding to the second and third exposure levels, respectively. Further, this enables to read and store outside of the pixel the kTC noise generated on storage node MEM_M and MEM_S, respectively, at the beginning of integration periods $T_M$ and $T_S$. These noise levels can then be subtracted to the signals integrated on nodes ST_M and ST_S at the end of integration periods $T_M$ and $T_S$.

The sequence of control signals AB, TG_L, TG_M, TG_S, RST, and RD described in relation with FIG. 4 may for example be substantially identically applied to pixel 300 of FIG. 8.

An advantage of the described embodiments is that the values of capacitances FD, MEM_M, and MEM_S may be specifically adapted according to the charge-to-voltage conversion gain which is desired to be applied for the reading of the charges photogenerated during the three integration periods $T_L$, $T_M$, and $T_S$. As an example, the values of capacitances MEM_M and MEM_S may be higher than the value of capacitance FD, for example, from 2 to 30 times higher than the value of capacitance FD, which enables to increase the durations of integration periods $T_M$ and $T_S$ with respect to a high dynamic range image sensor of the type described in relation with FIG. 1, where the charges photogenerated during the three successive integration periods $T_L$, $T_M$, and $T_S$ are converted into a voltage with a same conversion gain (defined by the capacitance of the sense node of the pixel). The lengthening of periods $T_M$ and $T_S$ especially enables to further increase chances of detecting blinking light sources during acquisition phase $T_{frame}$.

Another advantage of the described embodiments is that the dimensions of photodiodes PPD1 and PPD2 may be specifically adapted to the exposure levels which are desired to be obtained. In particular, photodiode PPD2 may have a surface area of exposure to light smaller than that of photodiode PPD1, for example, from 2 to 10 times smaller than that of photodiode PPD1, to generate a less intense photocurrent than photodiode PPD1. Here again, this enables to increase the durations of integration periods $T_M$ and $T_S$ with respect to a high dynamic range image sensor of the type described in relation with FIG. 1, where the photogenerated charges stored during the three successive integration periods $T_L$, $T_M$, and $T_S$ originate from a same photodiode. It should further be noted that, due to the fact that photodiode PPD2 is regularly emptied into capacitances MEM_M and MEM_S, the intrinsic charge storage capacitance of photodiode PPD2 may be much smaller than that of photodiode PPD1.

Further, an advantage of the described embodiments is that long integration period $T_L$ may occupy a larger portion of acquisition period $T_{frame}$ than in a sensor of the type described in relation with FIG. 1, where the sum of integration times $T_L$, $T_M$, and $T_S$ should be shorter than or equal to time $T_{frame}$.

Further, apart from the fact that they increase the probability of detecting blinking light sources, an advantage of the described embodiments is that they enable to improve the intrinsic dynamic range of the sensor with respect to existing high dynamic range sensors, by varying the ratios of the read capacitances to the dimensions of photodiodes, specific to the different integration periods $T_L$, $T_M$, and $T_S$.

Another advantage of the described embodiments is that the output values representative of the illumination levels of the pixel during periods $T_L$, $T_M$, and $T_S$ are read consecutively, that is, two successive readings of an output value of the pixel during a same acquisition phase $T_{frame}$ are not separated by an integration period of the pixel, as in sensors of the type described in relation with FIG. 1. Thus, the final pixel output value may be directly determined without having to store into memories the intermediate values read at the end of integration phases $T_L$ and $T_M$, as required in sensors of the type described in relation with FIG. 1. Further, this enables to limit artifacts due to possible motions of the scene or of the sensor during the acquisition. More particularly, the described embodiments enable to keep a time consistency between the measurements performed during integration periods $T_L$, $T_M$, and $T_S$, which may all three share a same time window.

Figure 9:
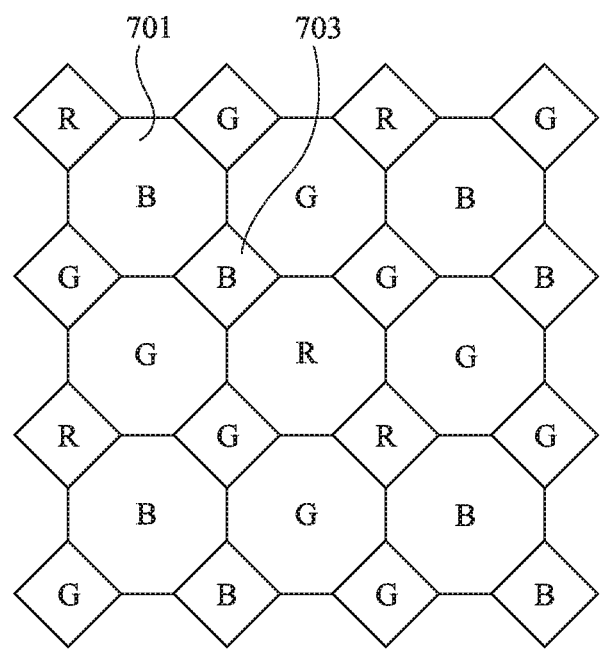
FIG. 9 is a top view schematically illustrating an example of layout of the pixels in an image sensor of the type described in relation with FIGS. 3 to 6.

FIG. 9 is a top view schematically illustrating an example of layout of the pixels in a high dynamic range image sensor of the type described in relation with FIGS. 3 to 6. In this example, each pixel comprises two photodiodes PPD1 and PPD2 (not shown in FIG. 9), photodiode PPD2 having, in top view, a smaller surface area than photodiode PPD1. In the example of FIG. 9, the sensor is a color image sensor where each pixel has its photodiodes PPD1 and PPD2 topped with a red (R), green (G), or blue (B) color filter. In this example, each pixel has its photodiode PPD1 topped with a microlens 701 substantially in the shape of a regular hexagon, and has its photodiode PPD2 topped with a microlens 703 substantially in the shape of a square, with a side length approximately equal to the side length of the regular hexagon forming microlens 701. Microlenses 701 and 703 covering photodiodes PPD1 and PPD2 of a same pixel of the sensor have a common side. Further, the layout of the pixels is such that microlenses 701 and 703 of the different sensor pixels substantially fill the entire surface area occupied by the pixel array of the sensor.

An advantage of the layout of FIG. 9 is that it enables to minimize the total surface area occupied by the sensor.

Specific embodiments have been described. Various alterations and modifications will be readily apparent to those skilled in the art. In particular, examples of operation and of a control method where each of integration periods $T_M$ and $T_S$ is divided into n regularly spaced apart sections of same duration $T_M/n$, respectively $T_S/n$ have been described hereabove. The described embodiments are however not limited to this specific case. As a variation, the durations and/or the spacing of the integration sub-periods of integration period $T_M$ may vary during acquisition phase $T_{frame}$. Similarly, the durations and/or the spacing of the integration sub-periods of integration period $T_S$ may vary during acquisition phase $T_{frame}$.

As an example, the durations of the integration sub-periods of integration period $T_M$ and the durations of the integration sub-periods of integration period $T_S$ may increase all along acquisition phase $T_{frame}$, or may decrease all along acquisition phase $T_{frame}$.

As a variation, the durations of the integration sub-periods of period $T_M$ on the one hand, and the durations of the integration sub-periods of integration period $T_S$ on the other hand, may be constant all along acquisition phase $T_{frame}$, but spaced apart two by two by a variable time period, for example, a time period which increases all along acquisition phase $T_{frame}$, or a time period which decreases all along acquisition phase $T_{frame}$.

As a variation, the integration sub-periods of integration period $T_M$ on the one hand, and the integration sub-periods of integration period $T_S$ on the other hand, may be randomly or semi-randomly distributed along acquisition phase $T_{frame}$.

Further, the described embodiments are not limited to the examples described hereabove where integration periods $T_M$ and $T_S$ are divided into a same number n of integration sub-periods. As a variation, integration period $T_M$ may be divided into n integration sub-periods and integration period $T_S$ may be divided into n' integration sub-periods, n and n' being integers greater than 1, for example, in the range from 10 to 500, and n being different from n'.

Further, although examples of high dynamic range image sensors where each pixel provides three output values corresponding to three different exposure levels have been described, the described embodiments are not limited to this specific case.

In particular, it will be within the abilities of those skilled in the art to adapt the described embodiments to a sensor where, for each acquisition, each pixel only provides two output values corresponding to two different exposure levels. In this case, each phase $T_{frame}$ of acquisition of a value representative of the illumination level of a pixel of the sensor may comprise an uninterrupted integration period $T_L$ of photodiode PPD1 of the pixel and, in parallel with integration period $T_L$, a single period $T_M$ of integration of photodiode PPD2 of the pixel, period $T_M$ being divided into a plurality of separate integration sub-periods. In this case, transistors 109, 115, 105_S, 117_S, and 119_S, may be omitted, as well as storage capacitance MEM_S of the examples of pixels described in relation with FIGS. 3 to 6.

Further, the number of divided and interlaced integration periods of photodiode PPD2 during a same acquisition phase $T_{frame}$ may be greater than 2.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:
1. An image sensor comprising:
  a plurality of pixels, each pixel of the plurality of pixels including, respectively, a first photodiode, a first transistor coupling the first photodiode to a first capacitive charge storage node, a second photodiode, and a second transistor coupling the second photodiode to a second capacitive charge storage node; and a control circuit configured to, during a phase of acquisition of a value representative of an illumination level of a pixel:

acquire a first output value representative of an illumination level received by the first photodiode during a first uninterrupted integration period; and acquire a second output value representative of an illumination level received by the second photodiode during a second integration period, the second integration period including a plurality of separate sub-periods, wherein, in operation, the image sensor determines a final output value representative of the illumination level of the pixel based on the first output value and the second output value.

2. The sensor of claim 1, wherein the second integration period is shorter than the first integration period, and wherein the sub-periods of the second integration period are distributed along a period substantially equal to the first integration period.

3. An image sensor comprising:

a plurality of pixels, each pixel of the plurality of pixels including, respectively, a first photodiode, a first transistor coupling the first photodiode to a first capacitive charge storage node, a second photodiode, a second transistor coupling the second photodiode to a second capacitive charge storage node, a third transistor, the second photodiode being coupled to a third capacitive charge storage node by the third transistor; and a control circuit configured to, during a phase of acquisition of a value representative of an illumination level of a pixel:

acquire a first output value representative of an illumination level received by the first photodiode during a first uninterrupted integration period;

acquire a second output value representative of an illumination level received by the second photodiode during a second integration period, the second integration period including a plurality of separate sub-periods; and acquire a third output value representative of an illumination level received by the second photodiode during a third integration period, the third integration period including a plurality of separate sub-periods.

4. The sensor of claim 3, wherein the third integration period is shorter than the first and second integration periods, respectively, and wherein the sub-periods of the third integration period are distributed along a period substantially equal to the first integration period.

5. The sensor of claim 3, wherein the sub-periods of the second integration period and the sub-periods of the third integration period are interlaced.

6. The sensor of claim 3, wherein the sub-periods of the second integration period have substantially the same duration and the same spacing, and wherein the sub-periods of the third integration period have substantially the same duration and the same spacing.

7. The sensor of claim 3, wherein the sub-periods of the second integration period have variable durations or spacings during the acquisition phase, and wherein the sub-periods of the third integration period have variable durations or spacings during the acquisition phase.

8. The sensor of claim 3, wherein the sub-periods of the second integration period and the sub-periods of the third integration period have a random or semi-random distribution.

9. The sensor of claim 3, each pixel of the plurality of pixels further including, respectively:

a fourth transistor coupling the second capacitive node to a fourth node;

a fifth transistor coupling the third capacitive node to the fourth node;

a sixth transistor coupling the fourth node to a reset node;

a seventh transistor, the first node being coupled to a gate terminal of the seventh transistor; and an eighth transistor coupling a source terminal of the seventh transistor to a first output conductive track.

10. The sensor of claim 9, each pixel of the plurality of pixels further including, respectively, a ninth transistor coupling the fourth node to the first node.

11. The sensor of claim 9, wherein, in each pixel, the fourth node is connected to the first node.

12. The sensor of claim 3, each pixel of the plurality of pixels further including:

first, second and third reset transistors, the first, second and third reset transistors respectively coupling the first, second, and third nodes to a reset node; and first, second and third follower source transistors, each of the first, second, and third nodes being coupled to a respective gate terminal of the first, second and third follower source transistors.

13. The sensor of claim 3, wherein a capacitance of the third capacitive charge storage node includes a capacitor having deep insulated trenches or a vertical metal-oxide-metal stack.

14. The sensor of claim 1, each pixel of the plurality of pixels further including a reset transistor, the reset transistor coupling the second photodiode to a reset node.

15. The sensor of claim 1, each pixel of the plurality of pixels further including:

a first microlens having a hexagonal shape, the first microlens covering at least a portion of the first photodiode; and a second microlens having a square shape, the second microlens covering at least a portion of the second photodiode, wherein a first side of the first microlens is positioned adjacent to a first side of the second microlens, the first side of the first microlens and the first side of the second microlens having substantially the same length.

16. The sensor of claim 1, wherein a capacitance of the second capacitive charge storage node includes a capacitor having deep insulated trenches or a vertical metal-oxide-metal stack.

17. An image sensor pixel, comprising:

a first photodiode;

a first capacitive charge storage node;

a first transistor coupling the first photodiode to the first capacitive charge storage node;

a second photodiode;

a second capacitive charge storage node; a second transistor coupling the second photodiode to the second capacitive charge storage node;

a third capacitive charge storage node; and a third transistor coupling the second photodiode to the third capacitive charge storage node.

18. The image sensor pixel of claim 17, wherein the image sensor pixel is coupled to a control circuit, the control circuit being configured to, during an acquisition phase:

acquire a first output value representative of an illumination level received by the first photodiode during a first uninterrupted integration period; and acquire a second output value representative of an illumination level received by the second photodiode during a second integration period, the second integration period including a plurality of separate sub-periods.

19. A method for determining an illumination level of a pixel, the method comprising:

acquiring a first output value representative of an illumination level received by a first photodiode of the pixel during a first uninterrupted integration period; and acquiring a second output value representative of an illumination level received by a second photodiode of the pixel during a second integration period, the second integration period including a plurality of separate sub-periods; and acquiring a third output value representative of an illumination level received by the second photodiode during a third integration period, the third integration period including a plurality of separate sub-periods.

20. The method of claim 19, further comprising:

determining a final output value representative of the illumination level of the pixel based on the first output value, the second output value, and the third output value.

* * * * *